United States Patent
Oyama et al.

(10) Patent No.: US 7,503,366 B2
(45) Date of Patent: Mar. 17, 2009

(54) ELECTRONIC COMPONENT FEEDING DEVICE

(75) Inventors: Kazuyoshi Oyama, Ashikaga (JP); Shigeru Kageyama, Ota (JP); Kazuhiro Nagao, Tochigi (JP); Tsutomu Yanagida, Gunma (JP)

(73) Assignee: Hitachi High-Tech Instruments Co., Ltd., Gunma (JP)

( * ) Notice: Subject to any disclaimer, the term of this patent is extended or adjusted under 35 U.S.C. 154(b) by 415 days.

(21) Appl. No.: 11/054,601

(22) Filed: Feb. 10, 2005

(65) Prior Publication Data
US 2005/0224183 A1    Oct. 13, 2005

(30) Foreign Application Priority Data
Feb. 13, 2004   (JP) ............................. 2004-037089

(51) Int. Cl.
*B32B 41/00*   (2006.01)
(52) U.S. Cl. .................. 156/361; 156/362; 156/367; 156/368; 318/34; 318/625
(58) Field of Classification Search ................. 156/361, 156/362, 367, 368; 318/625, 34
See application file for complete search history.

(56) References Cited

U.S. PATENT DOCUMENTS 5,191,693 A   3/1993   Umetsu
6,368,045 B1   4/2002   Ashman et al.
6,389,672 B1   5/2002   Ishii et al.
2003/0072644 A1   4/2003   Yamamura et al.
2003/0184250 A1*   10/2003   Kurokawa et al. .......... 318/560
2003/0230617 A1   12/2003   Saho

FOREIGN PATENT DOCUMENTS

JP     2000-077892   3/2000

OTHER PUBLICATIONS

European Search Report dated Aug. 13, 2007, directed to counterpart EP application No. 05003105.

* cited by examiner

*Primary Examiner*—George R Koch, III
(74) *Attorney, Agent, or Firm*—Morrison & Foerster LLP

(57) ABSTRACT

The invention provides a component feeding device where heat generation of a drive circuit is minimized and a printed board mounted with this drive circuit is miniaturized by forming an inexpensive structure using a single microcomputer and by energizing each of the servomotors only when necessary. In a component feeding unit of a dual lane type, a CPU in a microcomputer controls a start of driving of one of servomotors by energizing the servomotor through a drive circuit based on a component feeding signal for one lane outputted from a CPU of an electronic component mounting apparatus, and the CPU in the microcomputer controls one of the servomotors so that the servomotor is not energized when a component feeding signal for another lane is inputted before a predetermine time passes after a delay timer starts timekeeping when receiving a detection signal about rotation of the servomotor by a predetermined amount from an encoder detecting a rotation amount of the servomotor.

10 Claims, 12 Drawing Sheets

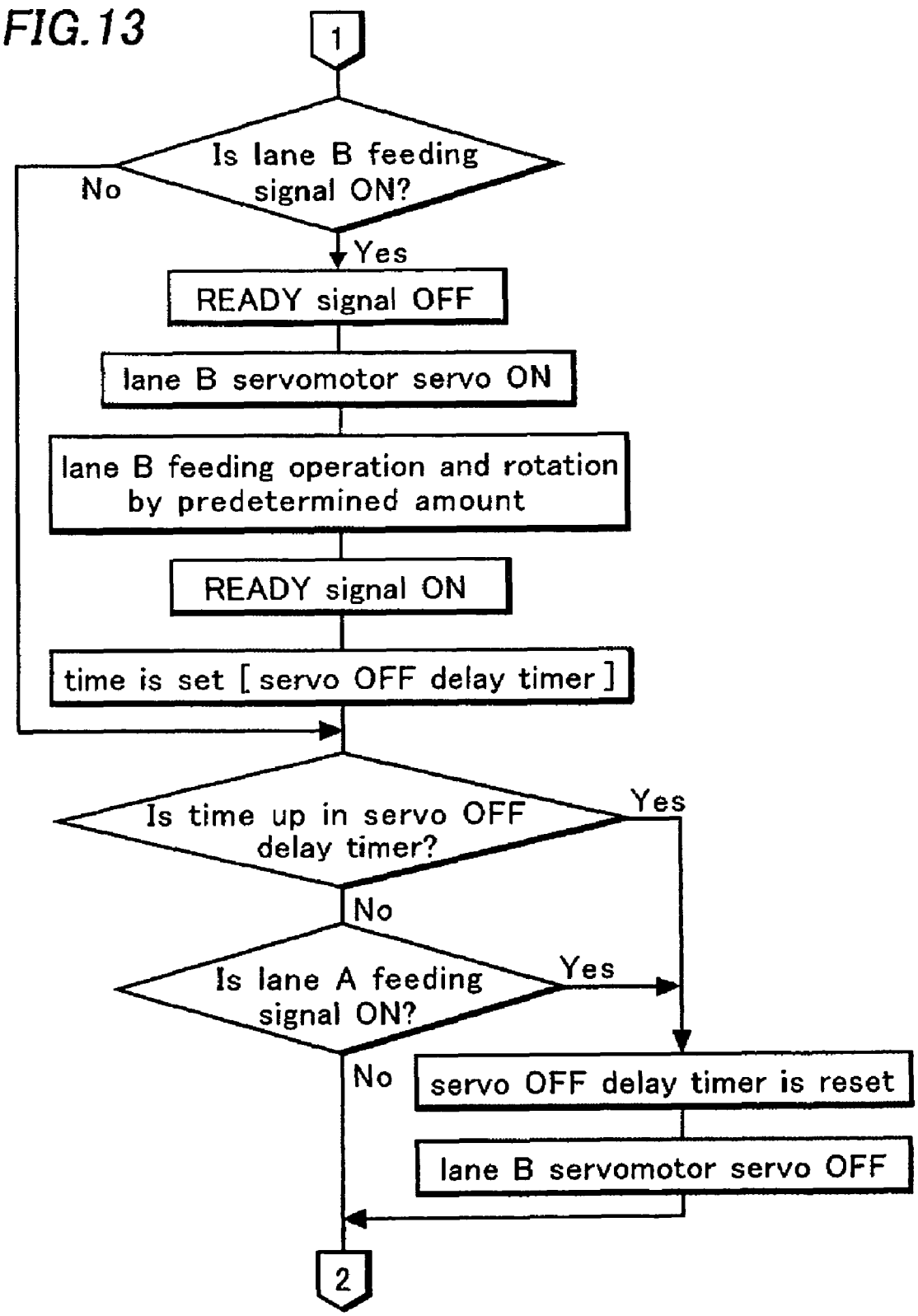

ELECTRONIC COMPONENT FEEDING DEVICE

BACKGROUND OF THE INVENTION

1. Field of the Invention

The invention relates to a component feeding device having a plurality of lanes each intermittently advancing a storage tape having electronic components stored in its storage portions to a component pickup position by each of servomotors.

2. Description of the Related Art

Generally, in a component feeding device intermittently advancing a storage tape having electronic components stored in its storage portions to a component pickup position, the storage tape can be advanced by any pitches by using a servomotor serving as a drive motor for advancing the storage tape. A printed board mounted with a drive circuit for driving the servomotor is built in the component feeding device. The relevant technology is described in the Japanese Patent Application Publication No. 2000-77892.

However, it costs much to form the component feeding device having a plurality of lanes each intermittently advancing the storage tape having the electronic components in its storage portions to the component pickup position by each of the servomotors, such as a component feeding device of a dual lane type. This is because the printed board built in such a component feeding device is mounted with microcomputers each provided for each of the servomotors.

Furthermore, in this case, the drive circuit generates high heat when a positioning loop is executed in each of the servomotors all the time to keep the servomotors ON (energized). This causes a dilemma between realizations of a compact feeding device and a design for heat radiation, thereby causing limitation in miniaturization of the printed board or the electronic component feeding device.

SUMMARY OF THE INVENTION

The invention provides a component feeding device that includes more than one feeding lane. Each of the feeding lanes includes a servomotor intermittently advancing a storage tape containing electronic components therein to a component pickup position. The device also has only one microcomputer disposed in the component feeding device and controlling the servomotors so that one of the servomotors is driven in response to a component feeding signal.

The invention also provide another component feeding device that includes more than one feeding lane. Each of the feeding lanes includes a servomotor intermittently advancing a storage tape containing electronic components therein to a component pickup position. The device has only one microcomputer disposed in the component feeding device and controlling the servomotors so that one of the servomotors starts in response to a component feeding signal and stops at a predetermined passage of time after the one of the servomotors is driven by a predetermined amount.

The invention provides other component feeding device that includes a feeding lane including a servomotor intermittently advancing a storage tape containing electronic components therein to a component pickup position and a microcomputer controlling the servomotor so that the servomotor starts in response to a component feeding signal and stops at a predetermined passage of time after the servomotor is driven by a predetermined amount.

BRIEF DESCRIPTION OF THE DRAWINGS

FIGS. 12 and 13 show an operation flowchart of the electronic component mounting apparatus of FIG. 1.

DETAILED DESCRIPTION OF THE INVENTION

An electronic component mounting apparatus having an electronic component feeding device of one embodiment of the invention will be described with reference to the attached drawings. This electronic component mounting apparatus is a so-called multifunctional chip mounter, which can mount a variety of electronic components on a printed board P.

Figure 1:
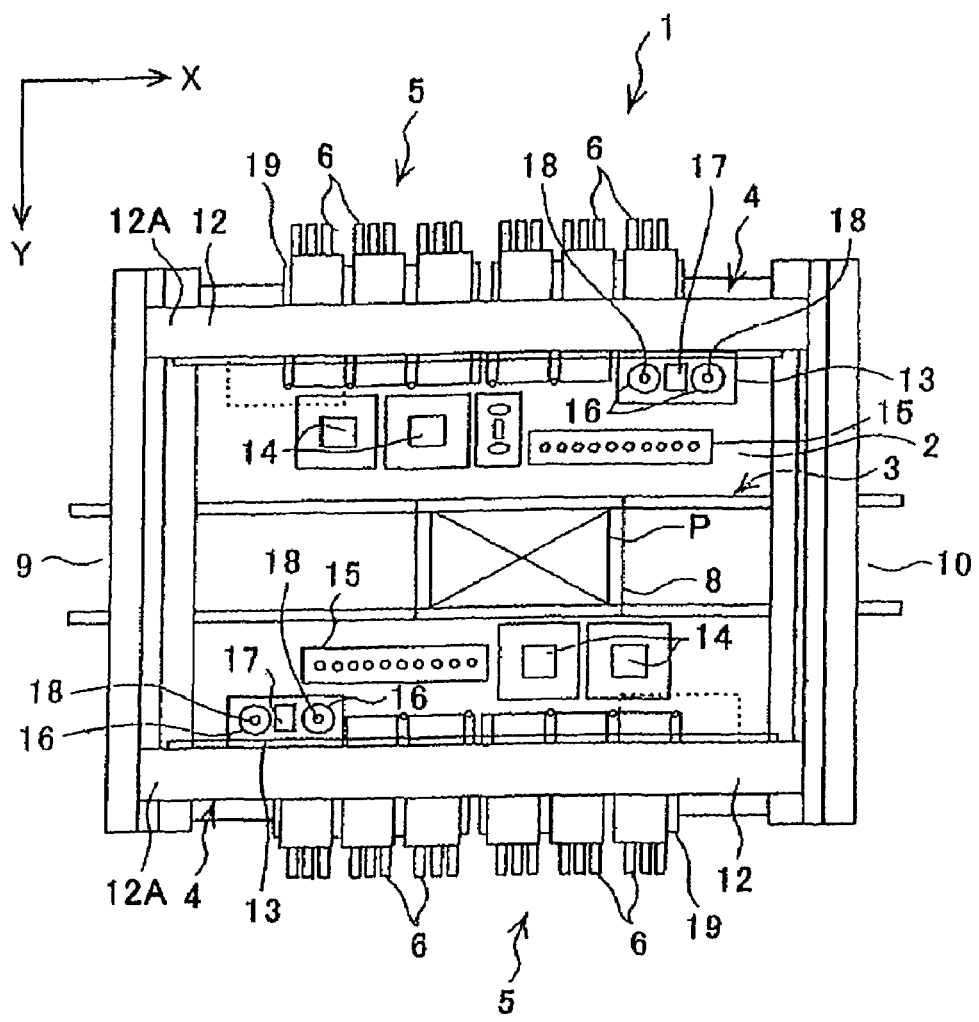
FIG. 1 is a plan view of an electronic component mounting apparatus of an embodiment of this invention.
Figure 2:
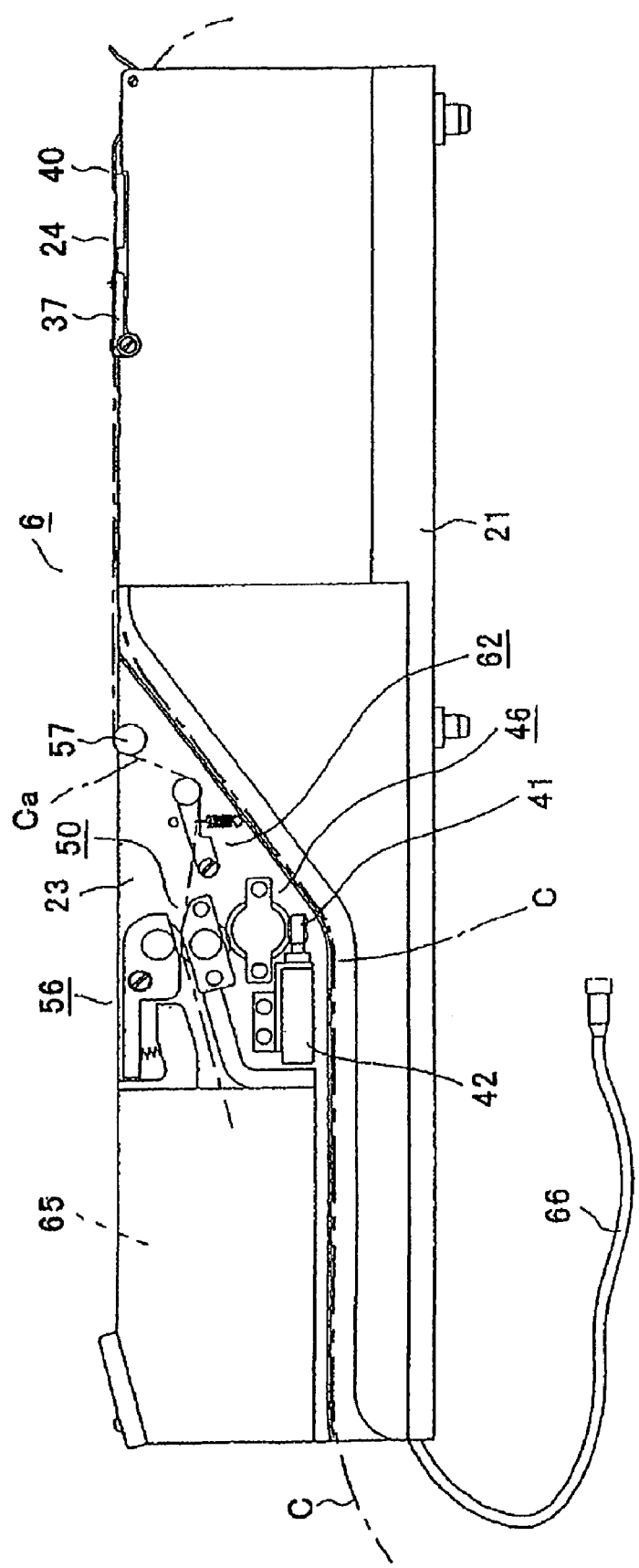
FIG. 2 is a side view of a component feeding unit of the component mounting apparatus of FIG. 1.
Figure 3:
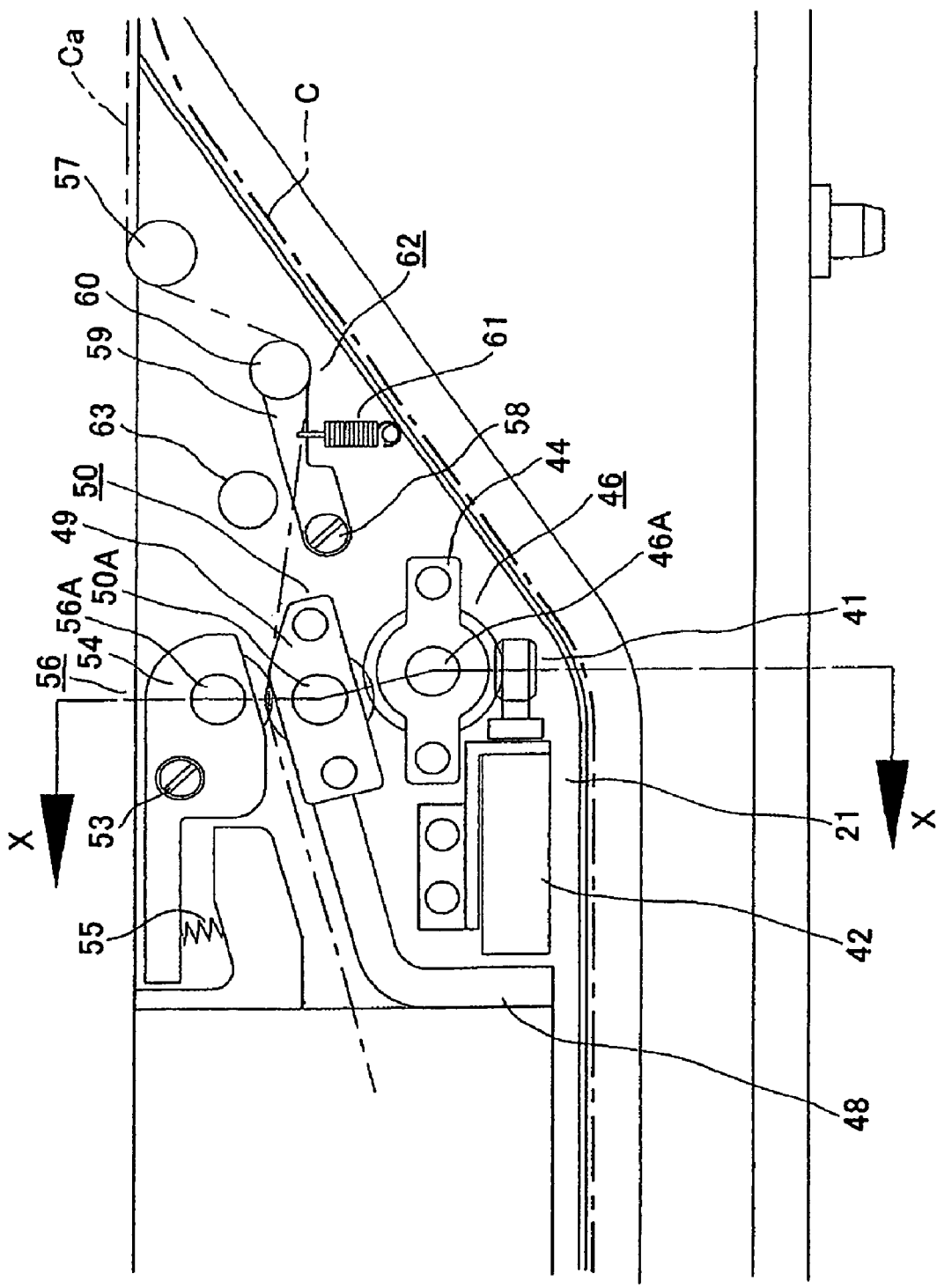
FIG. 3 is an enlarged view of a cover tape peeling system depicted in FIG. 2.
Figure 4:
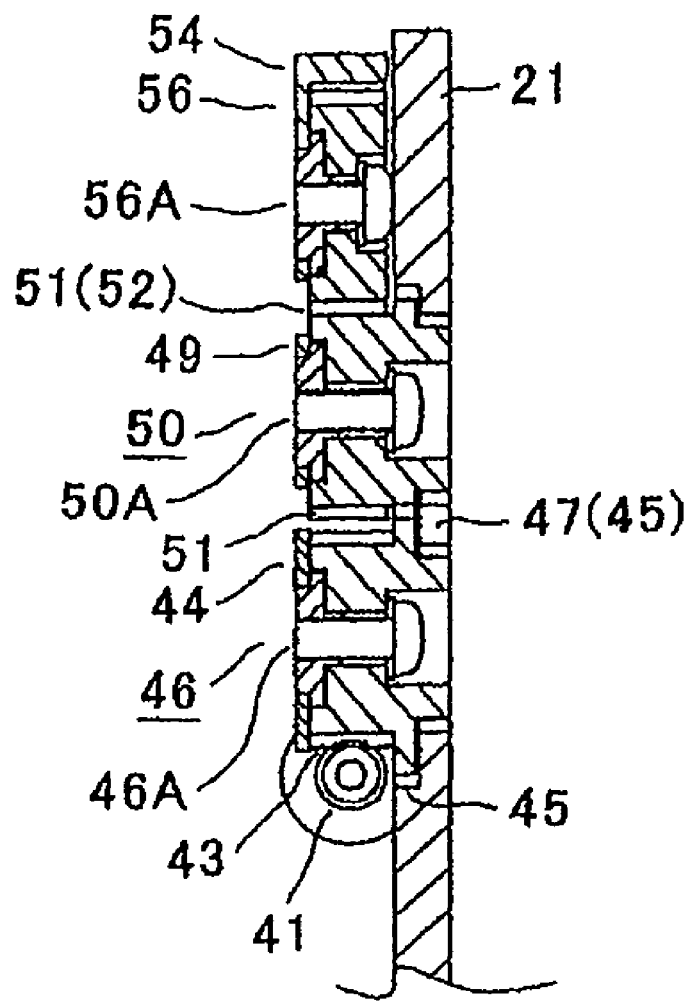
FIG. 4 is a cross-sectional view along line X-X of FIG. 3.
Figure 5:
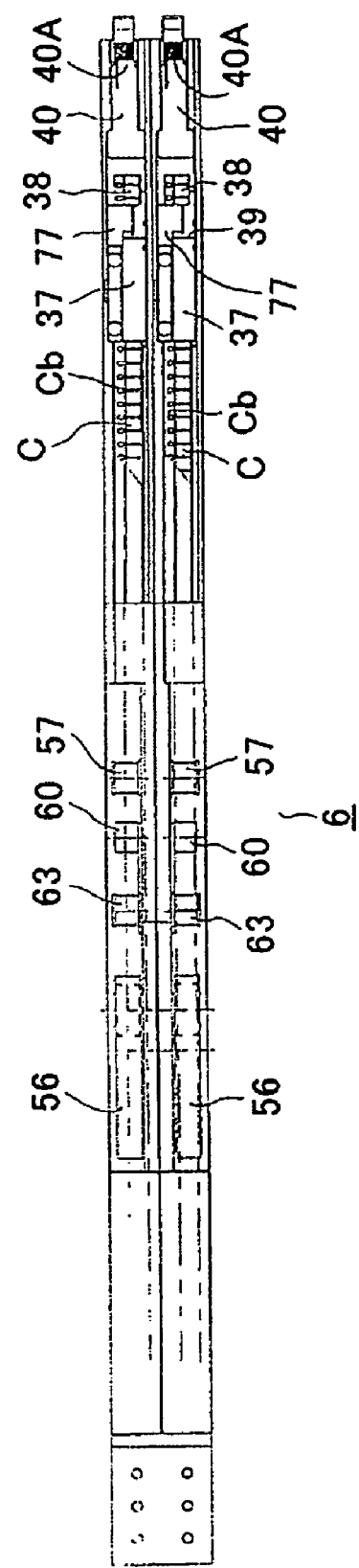
FIG. 5 is a plan view of the component feeding unit of FIG. 2.
Figure 6:
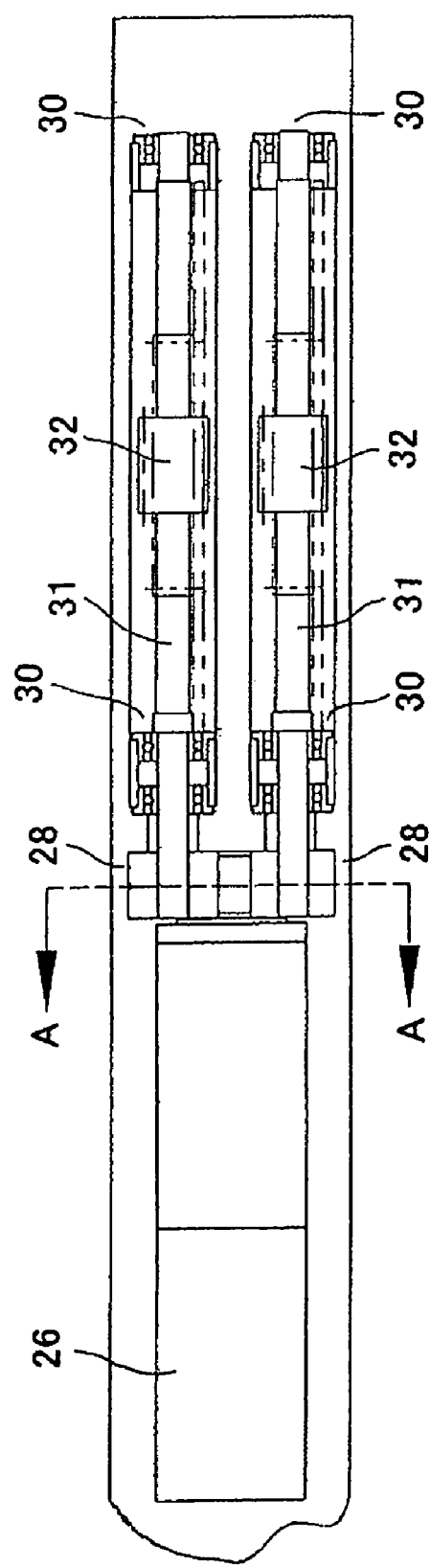
FIG. 6 is a plan view of a partial cross-section of the component feeding unit of FIG. 2.
Figure 7:
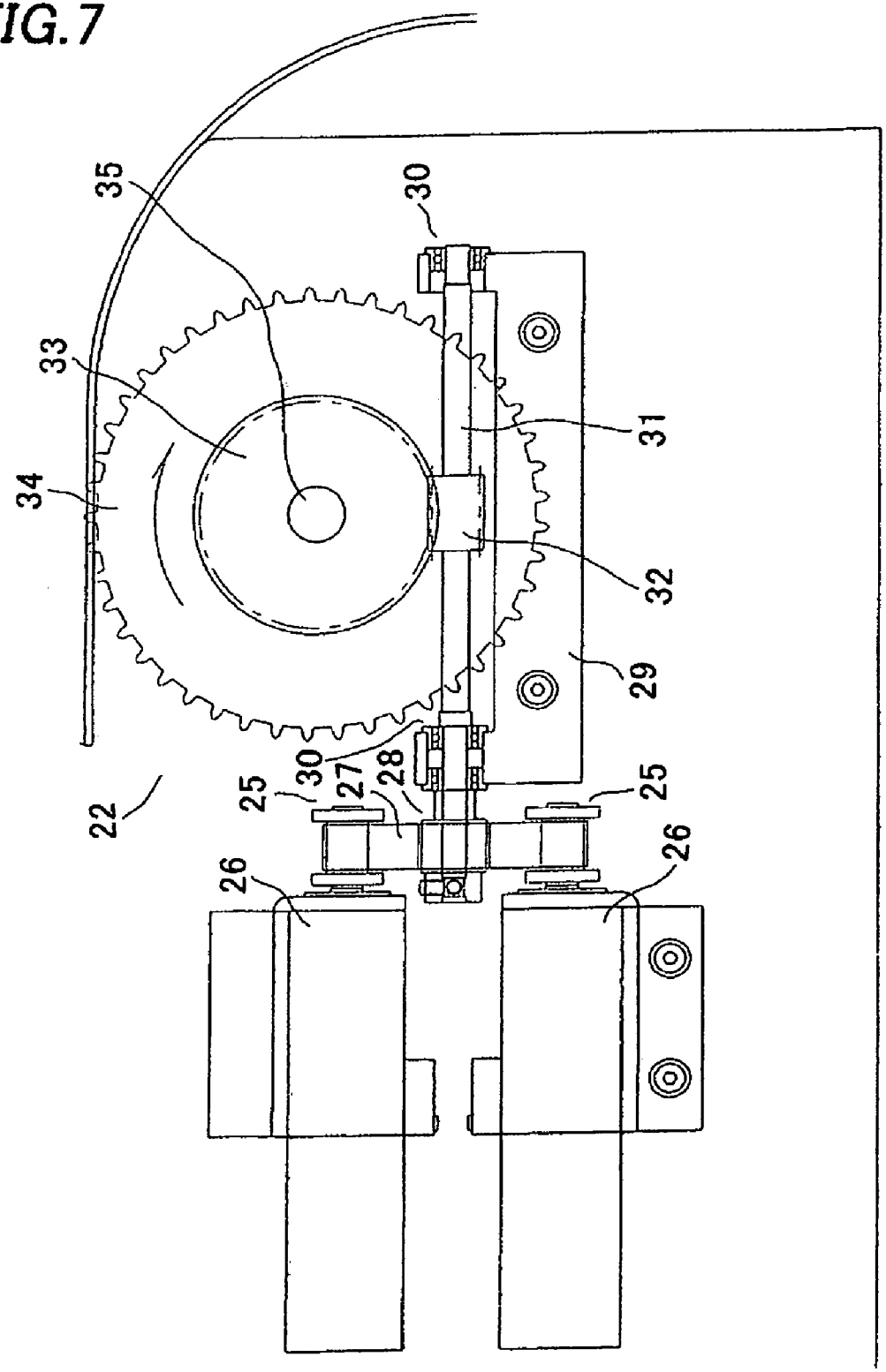
FIG. 7 is a partial side view of a feeding system of the component feeding unit of FIG. 2.
Figure 8:
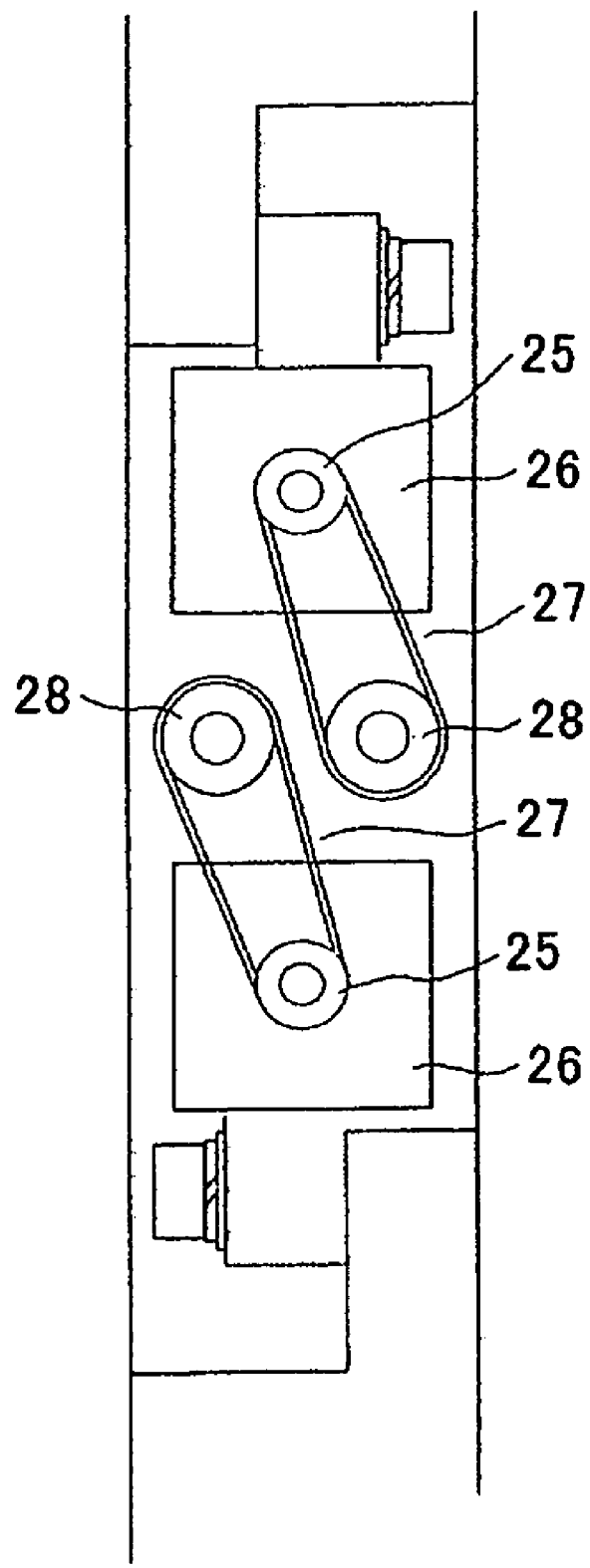
FIG. 8 is a cross-sectional view along line A-A of FIG. 6.

FIG. 1 is a plan view of the electronic component mounting apparatus. An electronic component mounting apparatus 1 includes a base 2, a conveyer portion 3 extending in a lateral direction in a center of the base 2, and two component mounting portions 4 and two component feeding portions 5 each provided on the front (on a lower side of FIG. 1) and the rear (on an upper side of FIG. 1) of the base 2. Each of the component feeding portions 5 is detachably set with a plurality of component feeding units 6 as the electronic component feeding device.

The conveyer portion 3 includes a central set table 8, a left feeding conveyer 9, and a right discharging conveyer 10. The printed board P is supplied from the feeding conveyer 9 to the set table 8, and is fixed at a predetermined height so as to be mounted with electronic components. After completing the electronic component mounting, the printed board P is discharged from the set table 8 to a downstream device through the discharging conveyer 10.

Each of the component mounting portions 4 is provided with an XY stage 12 movably mounted with a head unit 13, a component recognition camera 14, and a nozzle stocker 15. The head unit 13 is mounted with two mounting heads 16 for picking up and mounting the electronic components, and a board recognition camera 17 for recognizing the printed board P. Normally, the XY stages 12 of both the component mounting portions 4 are alternately driven.

In each of the XY stages 12, a beam 12A moves in a Y direction driven by a Y axis motor, and the head unit 13 moves in an X direction driven by an X axis motor. Therefore, the head unit 13 moves in the X and Y directions.

In each of the component feeding portions 5, many component feeding units 6 are laterally and detachably aligned on a unit base 19. Each of the component feeding units 6 is provided with a storage tape C storing many electronic components aligned at predetermined pitches, which will be described below. By intermittently advancing the storage tape C, the electronic components are fed one by one from an end of the component feeding unit 6 to the component mounting portion 4. In this electronic component mounting apparatus 1, a relatively small electronic component such as a surface mounting component is mainly fed from the component feeding unit 6, and a relatively large electronic component is fed from a tray-type component feeding device (not shown).

This electronic component mounting apparatus 1 is driven based on mounting data stored in a storage portion thereof. First, the XY stage 12 is driven, the head unit 13 moves to the component feeding unit 6, and then the mounting head 16 lowers to pick a required electronic component up by a suction nozzle 18 thereof. Then, the mounting head 16 rises up, and the XY stage 12 is driven to move the electronic component to a position right above the component recognition camera 14. The component recognition camera 14 recognizes a posture and a position of the electronic component on the suction nozzle 18. Next, the head unit 13 moves to above the printed board P on the set table 8, and the board recognition camera 17 recognizes a position of the printed board P. Then, an X axis motor 12A and a Y axis motor 12B of the XY stage 12, and a θ axis motor 18A of the suction nozzle 18 operate to correct the position of the electronic component by an amount based on a recognition result of the component recognition camera 14 and the board recognition camera 17, and then the electronic component is mounted on the printed board P.

The XY stage 12 of this embodiment is mounted with two mounting heads 16 (suction nozzles 18) so that two electronic components can be sequentially picked up and sequentially mounted on the printed board P. Furthermore, when the mounting head 16 has more than two suction nozzles 18, although not shown, more than two electronic components can be sequentially picked up and sequentially mounted on the printed board P.

As the component feeding unit 6, there are a single lane feeder intermittently advancing a storage tape by using a drive source and a dual lane feeder intermittently advancing two storage tapes by using two drive sources respectively. Description will be made on the component feeding unit 6 employing this dual lane feeder based on FIGS. 2 to 8. The component feeding unit 6 is so structured that an electronic component is fed from each of the two storage tapes C by each of the two drive sources independently. The component feeding unit 6 includes a unit frame 21, two storage tape reels (not shown) rotatably mounted on the unit frame 21, two tape feeding systems 22 for intermittently advancing the storage tape C let out from the storage tape reel reeled with the storage tape C to a position where the electronic component is picked up by the suction nozzle 18 (component pickup position), two cover tape peeling systems 23 for peeling a cover tape Ca from the storage tape C just before the pickup position, and two shutter systems 24 which enables picking-up of the electronic component by opening above the electronic component fed to the pickup position.

The storage tape C let out from each of the storage tape reels is advanced to the pickup position under a suppressor 37 which is provided just before the pickup position in a tape route. This suppressor 37 is formed with an opening 38 for picking, and integrated with a shutter 77 of the shutter system 24 near the opening 38. The suppressor 37 is formed with a slit 39 on one side of the shutter 77. The cover tape Ca of the storage tape C is peeled off at the slit 39, and stored in a storage portion 65 of the cover tape peeling system 23, which will be described below. That is, the electronic component stored in storage tape C is fed to a position under the shutter 77, which opens and closes the opening 38 for picking, with the cover tape Ca being peeled off. A numeral 40 is a suppressor clamp pushing the suppressor 37 downward by a spring 40A.

The tape feeding systems 22 will be described based on FIGS. 5 to 8. Each of the tape feeding systems 22 includes a servomotor 26 provided with a gear 25 at its output axis and rotatable forward and backward, a rotation axis 31 having a gear 28 at its one end which is set with a timing belt 27 stretched from the gear 25 and rotatably supported by a support body 29 through a bearing 30, and a sprocket 34 having a worm wheel 33 engaged with a worm gear 32 provided in a center of the rotation axis 31 and advancing the storage tape C by being engaged with feeding holes Cb formed in the tape C.

Under this structure, when one of the servomotors 26 is driven to rotate forward for supplying the electronic component in the storage tape C in the component feeding unit 6, the gears 25 and 28 rotate through the timing belt 27 to rotate only the rotation axis 31, and the sprocket 34 intermittently rotates by a predetermined angle in a feeding direction through the worm gear 32 and the worm wheel 33, thereby intermittently advancing one of the storage tapes C through the feeding holes Cb.

The cover tape peeling system 23 will be described based on FIGS. 2 to 5. Each of the cover tape peeling systems 23 includes a drive motor 42, a first rotating body 46, a second rotating body 50, a third rotating body 56, a roller 57, and a tension applying body 62. The drive motor 42 is provided with a worm gear 41 at its output axis. The first rotating body 46 is provided with a gear 43 engaged with a gear 45 and the gear 41 therearound, and is rotatably supported by a supporting body 44 through a support axis 46A, the supporting body 44 being fixed on the unit frame 21. The second rotating body 50 is provided with a gear 47 engaged with a contact portion 51 and the gear 45 therearound, and is rotatably supported by a supporting body 49 through a support axis 50A, the supporting body 49 being fixed on the unit frame 21 through an attachment body 48. The third rotating body 56 is provided with a contact portion 52 contacting with the contact portion 51 being pushed by a spring 55 therearound, and is rotatably supported by an attachment body 54 through a support axis 56A, the attachment body 54 being fixed on the unit frame 21 and rotatable through a support axis 53. The roller 57 is provided for guiding the cover tape Ca. The tension applying body 62 is provided with a roller 60 for guiding the cover tape Ca guided by the roller 57 on an end of an attachment body 59, the attachment body 59 being fixed on the unit frame 21 and rotatable around a support axis 58, and applies tension to the cover tape Ca being pushed by a spring 61. A numeral 63 designates a stopper for limiting rotation of the attachment body 59 there.

When the cover tape Ca is to be peeled off, the drive motor 42 is driven to rotate the first rotating body 46 through the gears 41 and 43. By the rotation of the first rotating body 46, the second rotating body 50 rotates through the gears 45 and 47. By rotation of the second rotating body 50, the third rotating body 56 rotates with the cover tape Ca being interposed between the contact portions 52 and 51 pushed by the spring 55. Then, the cover tape Ca is peeled from the storage tape C by a pitch at the slit 28 of the suppressor 37 without generating the slack, and is stored in the storage portion 65 provided in an end of the component feeding unit 6.

Each of the shutter systems 24 includes a drive motor having an output axis as a screw axis, an operation body fixed to a nut body engaged with the screw axis, and a shutter 77 slidably provided on the suppressor 37. The shutter 77 has a bending piece formed with a groove to be fit with a pin protruding from the operation body, and has a fitting piece fitted in a guide groove provided in the suppressor 37, being slidable on the suppressor 37. For opening or closing the opening 38 for picking by shifting the shutter 77, the drive motor is driven to shift the nut body engaged with the screw axis and the operation body, and then shift the fitting piece along the guide groove, so that the shutter 77 shifts to open or close the opening 38.

When the shutter 77 is shifted to a closing position, the shutter 77 closes the opening 38, preventing the electronic component fed to the pickup position from jumping out of the storage portion of the storage tape C which the cover tape Ca is peeled from. When shifted to an opening position, the shutter 77 recedes from above the electronic component to enable picking of the component by the suction nozzle 18.

A numeral 66 is a power source line for supplying power to the servomotors 26 and the drive motors 42.

Next, timings of advancing of the storage tape C, peeling of the cover tape Ca, and opening or closing of the shutter 77 will be described. The CPU 80 of the electronic component mounting apparatus 1, which will be described below, drives one of the tape feeding systems 22 of the predetermined component feeding unit 6 to advance the storage tape C storing a predetermined electronic component by one pitch, according to mounting data (data on a type of a component to be mounted, and mounting position and posture of the component on a printed board) stored in the RAM 81. In detail, one of the servomotors 26 is driven to rotate forward, the gears 25 and 28 rotate to rotate the rotation axis 31, and the sprocket 34 intermittently rotates in a forward direction by a predetermined angle through the worm gear 32 and the worm wheel 33, thereby intermittently advancing one of the storage tapes C through the feeding holes Cb. At this time, another rotation axis 31 does not rotate so that another storage tape C is not advanced.

As this tape feeding system 22 is driven, the corresponding cover tape peeling system 23 peels the cover tape Ca from the storage tape C by one pitch synchronously. Then, as the tape feeding system 22 and the cover tape peeling system 23 stop, the shutter system 24 performs opening operation to open the shutter 77 above the electronic component fed to the pickup position.

As the shutter 77 opens, the suction nozzle 18 picks up the electronic component. Then, the shutter 77 closes, and at the same time as this, the next advancing of the storage tape C and the next peeling of the cover tape Ca are performed.

Figure 9:
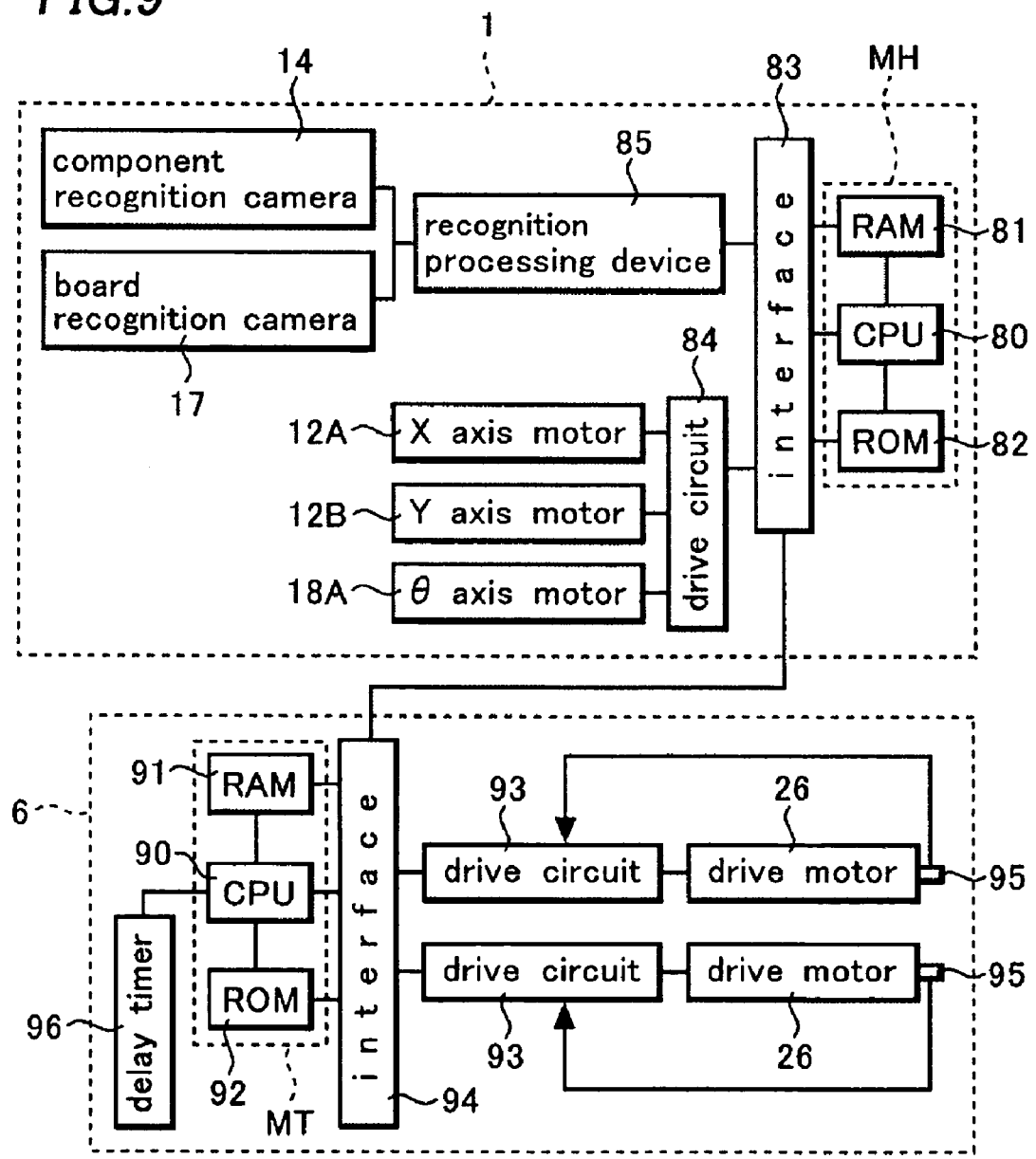
FIG. 9 is a control block diagram of the electronic component mounting apparatus of FIG. 1.

Next, a control block diagram of the electronic component mounting apparatus 1 and the component feeding unit 6 will be described based on FIG. 9. MH designates a microcomputer including a CPU 80 as a control device for controlling operations relating to the picking and mounting operations of the electronic component mounting apparatus, a RAM (random access memory) 81 as a storage device, and a ROM 82 (read only memory). The CPU 80 controls each of the drive sources through the interface 83 and the drive circuit 84 for the component picking and mounting operations of the electronic component mounting apparatus, according to a program stored in the ROM 82 and based on data stored in the RAM 81.

The RAM (random access memory) 81 stores mounting data including X and Y coordinates, mounting angles, and component disposition numbers in the component feeding portions 5 in step order (in mounting order), and component data including X and Y sizes or numbers of the suction nozzles 18 to be used for each of the component types.

A numeral 85 designates a component recognition processing device connected with the CPU 80 through the interface 83. The component recognition processing device 85 recognizes an image of the electronic component taken and stored by the component recognition camera 14 or the board recognition camera 17, and sends a recognition result to the CPU 80. That is, the CPU 80 outputs a command of recognizing the electronic component image (e.g. calculating a shifted amount from a proper position) taken by the component recognition camera 14 or the board recognition camera 17 to the component recognition processing device 85, and receives the recognition result from the component recognition processing device 85.

When recognizing a shifting amount of the component from a proper position by performing the recognition process, the recognition processing device 85 sends a result of the recognition to the CPU 80. The CPU 80 moves the suction nozzle 18 in the X and Y directions by driving the X axis motor 12A and the Y axis motor 12B, and rotates the suction nozzle 18 by θ by driving the θ axis motor 18A, thereby completing alignment of the component position in the X and Y directions and at a rotation angle around a vertical axis.

MT is a single microcomputer provided in the component feeding unit 6 employing the dual lane feeder intermittently advancing each of the storage tapes by using each of the two drive sources. The microcomputer MT includes a CPU 90 mounted on a printed board (not shown) built in the component feeding unit 6, a RAM 91, and a ROM 92. Numerals 93 designate drive circuits of the servomotors 26 connected with the CPU 90 through the interface 94, respectively. Numerals 95 designates encoders of the servomotors 26, respectively.

The CPU 90 provided in the component feeding unit 6 is connected with the CPU 80 provided in the electronic component mounting apparatus 1 through the interfaces 94 and 83.

Figure 10:
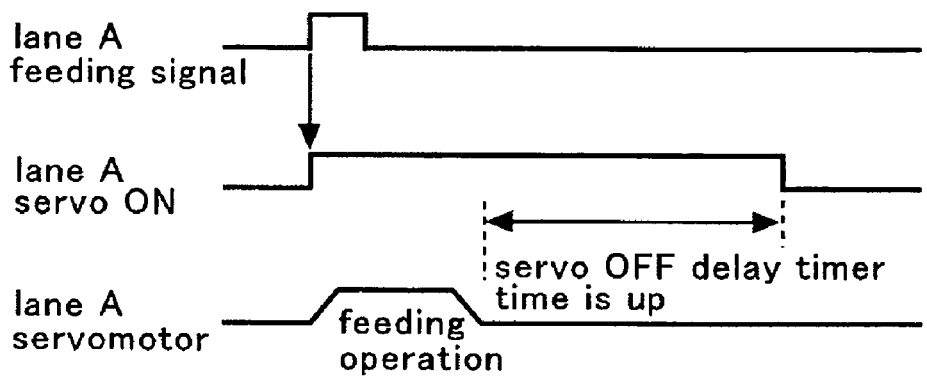
FIG. 10 is an operation timing chart of the component feeding unit of FIG. 2 in a case where a servomotor turns OFF when time passes after a feeding operation of a lane A is completed.
Figure 11:
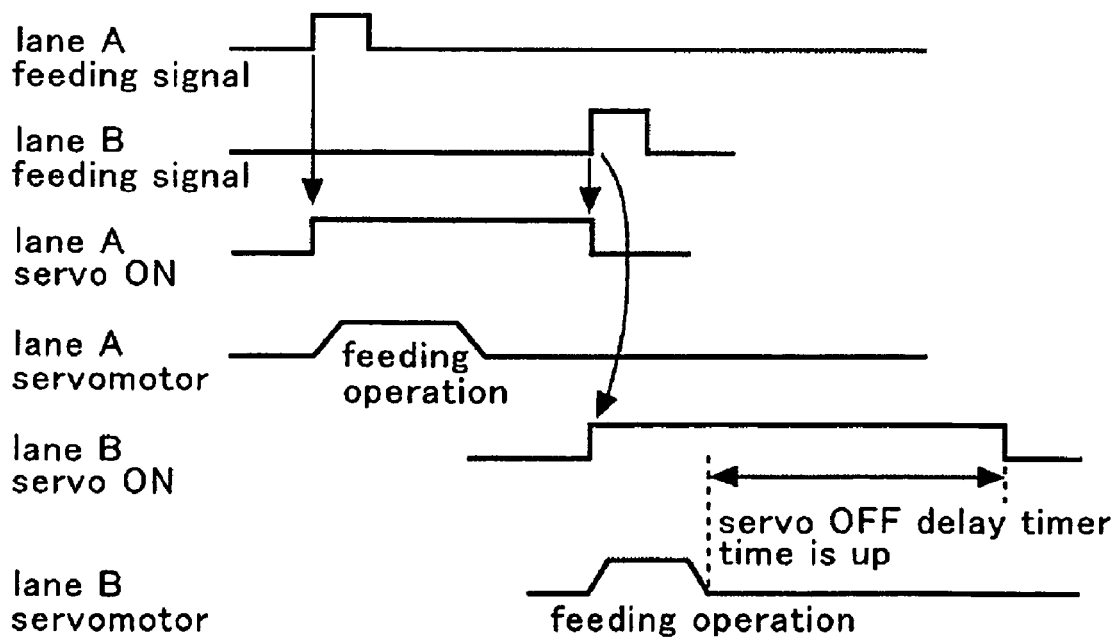
FIG. 11 is an operation timing chart of the component feeding unit of FIG. 2 in case where the servomotor of the lane A turns OFF when a lane B feeding signal is inputted after the feeding operation of the lane A is completed.
Figure 12:
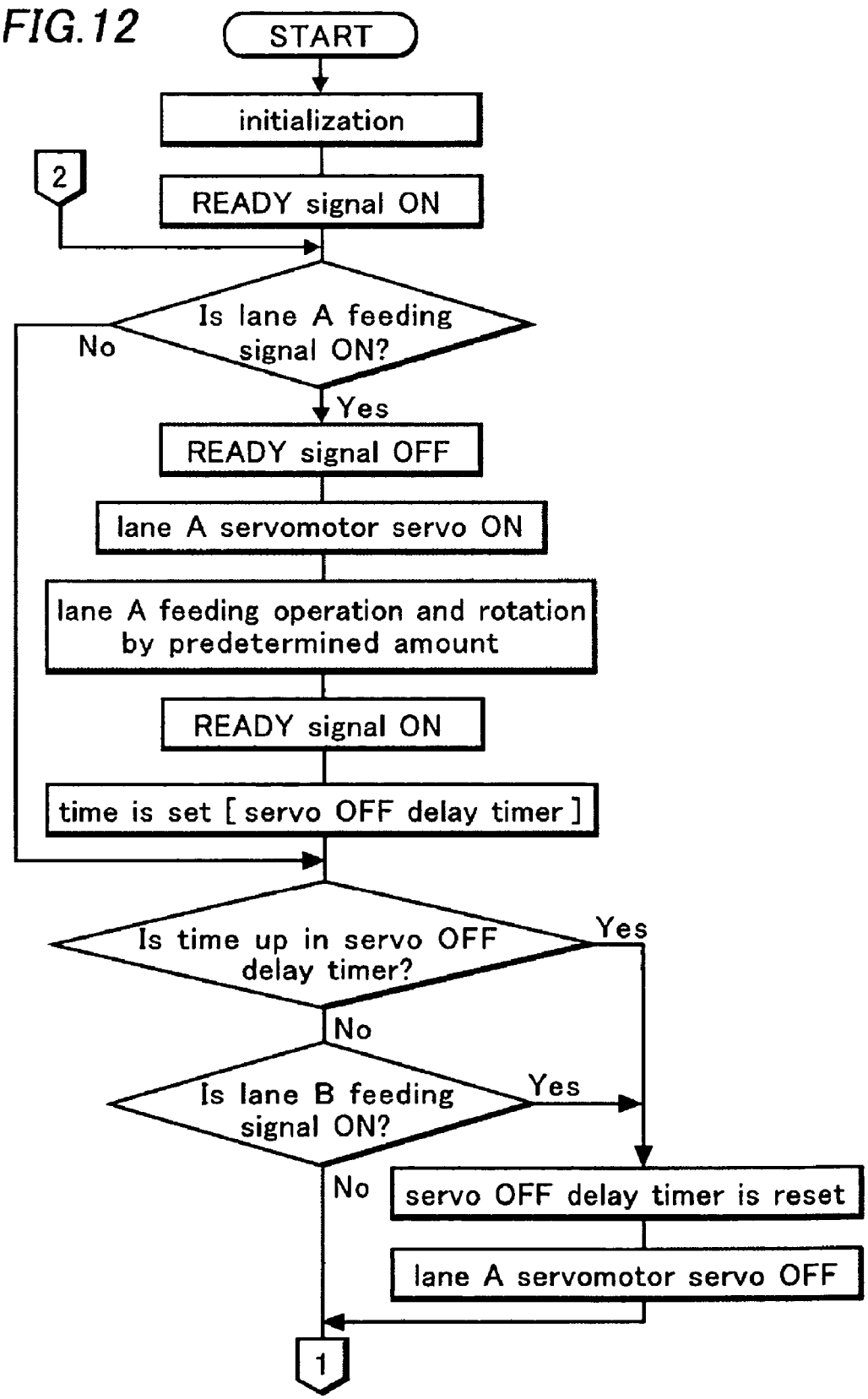

Under this structure, description will be made on a flowchart of an operation of the component feeding unit 6 shown in FIGS. 12 and 13 and on a timing chart shown in FIGS. 10 and 11. The CPU 90 of the component feeding unit 6 performs initialization, and outputs a READY signal to the CPU 80 of the electronic component mounting apparatus 1 to inform the apparatus 1 of that the component feeding unit 6 is ready to perform the feeding operation of the storage tape C.

Then, the CPU 80 outputs a feeding signal for a lane A which is one of the lanes in the component feeding unit 6 employing the dual lane feeder based on the mounting data stored in the RAM 81, in order to control the component feeding operation in the component feeding unit 6. The CPU 90 inputted with this feeding signal for the lane A stops outputting the READY signal, and turns the servomotor 26 of the lane A in a servo ON state (a state where the servomotor is energized) through the drive circuit 93 to perform the component feeding operation of the storage tape C in the lane A. In this operation, as described above, one of the servomotors 26 starts driving, the gears 25 and 28 rotate to rotate the rotation axis 31, the sprocket 34 intermittently rotates by a predetermined angle in a feeding direction through the worm gear 32 and the worm wheel 33, thereby intermittently advancing one of the storage tapes C through the feeding holes Cb. It is noted that even when the lane A is in a servo OFF state (a state where the servomotor 26 is not energized), the encoder 95 observes a position of the servomotor 26 in the lane A. A positional shifting amount of the servomotor 26 in the servo OFF state is added to a predetermined rotation amount of the servomotor 26 in the servo ON state, thereby establishing a proper rotation amount of the servomotor 26 to a predetermined position. Then, a delay timer 96, which will be described below, delays a start of the servo OFF state until the component pickup in the lane A is completed after the servomotor 26 rotates by the proper amount to reach the predetermined position. The control of rotation of the servomotor 26 in the lane A is kept in this manner.

Then, when the servomotor 96 of the lane A rotates to reach the predetermined position by the encoder 95, the CPU 90 outputs the READY signal to the CPU 80 of the electronic component mounting apparatus 1 to inform the apparatus 1 of that the component feeding unit 6 is ready to perform the advancing operation of the storage tape C. In the electronic component mounting apparatus 1, when inputted with the READY signal, the CPU 80 drives the XY stage 12 to move the head unit 13 to the lane A of the component feeding unit 6, and then lowers the mounting head 16 to pick up the required electronic component by the suction nozzle 18.

When the CPU 90 outputs the READY signal to the CPU 80, the CPU 90 starts timekeeping by the delay timer 96 for servo OFF at the same time. The CPU 90 resets the delay timer 96 when the CPU 90 checks and finds a feeding signal for the lane B based on the mounting data from the CPU 80 when a predetermined time, which is a little longer time than the time required for completing the component pickup after the servomotor 26 rotates by the proper amount, does not pass yet, or when the predetermined time passes. Then, the CPU 90 turns the servomotor 26 of the lane A OFF through the drive circuit 93 (FIG. 12).

Then, when the predetermined time of the delay timer 96 does not pass yet and the CPU 90 does not find the feeding signal for the lane B or when the servomotor 26 of the lane A turns OFF as described above, as shown in FIG. 13, the CPU 90 checks whether or not the feeding signal for the lane B is outputted from the CPU 80. When the CPU 90 finds the feeding signal for the lane B, the CPU 90 stops outputting the READY signal to the CPU 80, and turns the servomotor 26 of the lane B ON through the drive circuit 93 to start the component advancing operation of the storage tape C in the lane B. That is, another of the servomotors 26 is driven and rotated by a predetermined amount to intermittently advance the storage tape C. It is noted that even when the lane B is in a servo OFF state (a state where the servomotor 26 is not energized), the encoder 95 observes a position of the servomotor 26 in the lane B. A positional shifting amount of the servomotor 26 in the servo OFF state is added to a predetermined rotation amount of the servomotor 26 in the servo ON state, thereby establishing a proper rotation amount of the servomotor 26 to a predetermined position. Then, a delay timer 96, which will be described below, delays a start of the servo OFF state until the component pickup in the lane B is completed after the servomotor 26 rotates by the proper amount to reach the predetermined position. The control of rotation of the servomotor 26 in the lane B is kept in this manner.

In this case, when the servomotor 26 in the lane B rotates to reach the predetermined position by the encoder 95, the CPU 90 outputs the READY signal to the CPU 80 based on a signal from the encoder 95. In the electronic component mounting apparatus 1, when the CPU 80 is inputted with this READY signal, the CPU 80 moves the head unit 13 to the lane B of the component feeding unit 6, and then lowers the mounting head 16 to pick up the required electronic component by the suction nozzle 18.

In a similar manner to the case of the lane A, at the same time when the CPU 90 outputs the READY signal to the CPU 80, the CPU 90 starts timekeeping by the delay timer 96 for servo OFF. The CPU 90 checks whether or not the predetermined time passes in the delay timer 96. The CPU 90 resets the delay timer 96 when the CPU 90 finds the feeding signal for the lane A from the CPU 80 when a predetermined time does not pass yet, or when the predetermined time passes, and turns the servomotor 26 of the lane B OFF through the drive circuit 93 (FIG. 13).

When the predetermined time of the delay timer 96 does not pass yet and the CPU 90 does not find the feeding signal for the lane A or when the servomotor 26 of the lane B turns OFF as described above, as shown in FIG. 12, the CPU 90 checks whether or not the feeding signal for the lane A is outputted from the CPU 80, and the same control as described above is performed then.

As described above, this embodiment can provide a component feeding unit where the control device of the component feeding unit 6 can have an inexpensive structure, heat generation at the drive circuit 93 and the printed board mounted with this drive circuit 93 can be minimized, and the printed board can be miniaturized, since the servomotors 26 are energized by the single microcomputer MT only when necessary.

Although the above description is made on the dual lane feeder intermittently advancing the two storage tapes by the two drive sources respectively in this embodiment, the invention is not limited to this. The invention can be applied to a component feeding unit intermittently advancing two storage tapes by switching a drive source, and further to a component feeding unit intermittently advancing three or more storage tapes.

Furthermore, even in the component feeding unit employing a feeder having a lane, a servo OFF state is delayed by the delay timer and the servomotor is energized only when necessary, in a similar manner to the case of the dual lane feeder. This can provide a component feeding device where heat generation at the drive circuit and the printed board provided with the drive circuit can be minimized and the printed board can be miniaturized Although a multifunctional chip mounter is employed as an example of the electronic component mounting apparatus for describing the embodiment, the invention is not limited to this but can be applied to a high speed chip mounter of a rotary table type.

Although the embodiment of the invention have been disclosed in detail, it is recognized that variations or modifications of the disclosed apparatus are possible based on the disclosure and they lie within the scope of the present invention.

What is claimed is:

1. A component feeding device comprising:
    a plurality of feeding lanes, each of the feeding lanes comprising a servomotor intermittently advancing a storage tape containing electronic components therein to a component pickup position; and
    only one microcomputer disposed in the component feeding device and controlling the servomotors so that one of the servomotors is driven in response to a component feeding signal, wherein the component feeding device is mounted detachably on a unit base of an electronic component mounting apparatus comprising a CPU disposed outside the component feeding device, and the microcomputer of the component feeding device is not the CPU of the electronic component mounting apparatus.

2. The component feeding device of claim 1, wherein the microcomputer is configured to switch on and off the servomotors.

3. The component feeding device of claim 1, wherein the microcomputer is configured to receive the component feeding signal from the electronic component mounting apparatus that cooperates with the component feeding device.

4. A component feeding device comprising:
   a plurality of feeding lanes, each of the feeding lanes comprising a servomotor intermittently advancing a storage tape containing electronic components therein to a component pickup position;
   only one microcomputer disposed in the component feeding device and controlling the servomotors so that one of the servomotors starts in response to a component feeding signal and stops at a predetermined passage of time from an end of one advancement of the storage tape driven by the one of the servomotors; and
   a delay timer notifying the microcomputer of the predetermined passage of time so that the only one microcomputer stops the one of the servomotors at the predetermined passage of time.

5. The component feeding device of claim 4, further comprising a drive circuit energizing a corresponding servomotor.

6. The component feeding device of claim 4, wherein the microcomputer is configured to receive the component feeding signal from an electronic component mounting apparatus that cooperates with the component feeding device.

7. A component feeding device comprising:
   a feeding lane comprising a servomotor intermittently advancing a storage tape containing electronic components therein to a component pickup position;
   a microcomputer controlling the servomotor so that the servomotor starts in response to a component feeding signal and stops at a predetermined passage of time from an end of one advancement of the storage tape driven by the servomotor; and
   a delay timer notifying the microcomputer of the predetermined passage of time so that the microcomputer stops the servomotor at the predetermined passage of time.

8. The component feeding device of claim 7, further comprising a drive circuit energizing a corresponding servomotor.

9. The component feeding device of claim 7, wherein the microcomputer is configured to receive the component feeding signal from an electronic component mounting apparatus that cooperates with the component feeding device.

10. An electronic component mounting apparatus, comprising:
   a mounting head;
   a CPU controlling the mounting head;
   a plurality of component feeding devices, each comprising a plurality of feeding lanes, each of the feeding lanes comprising a servomotor intermittently advancing a storage tape containing electronic components therein to a component pickup position,
   wherein each of the component feeding devices comprises only one microcomputer controlling corresponding servomotors so that one of the corresponding servomotors is driven in response to a component feeding signal, and the CPU and the microcomputers are physically separated from each other.

* * * * *